(12) United States Patent
Porter et al.

(10) Patent No.: US 7,018,889 B2
(45) Date of Patent: Mar. 28, 2006

(54) LATCH-UP PREVENTION FOR MEMORY CELLS

(75) Inventors: John D. Porter, Meridian, ID (US); William N. Thompson, Meridan, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/869,128

(22) Filed: Jun. 16, 2004

(65) Prior Publication Data

US 2004/0223378 A1    Nov. 11, 2004

Related U.S. Application Data

(62) Division of application No. 09/740,174, filed on Dec. 18, 2000, now Pat. No. 6,767,784, which is a division of application No. 09/368,710, filed on Aug. 5, 1999, now Pat. No. 6,376,297, which is a division of application No. 09/045,465, filed on Mar. 20, 1998, now Pat. No. 6,005,797.

(51) Int. Cl.
H01L 21/8234    (2006.01)
H01L 21/8244    (2006.01)

(52) U.S. Cl. ............... 438/238; 438/199; 438/202; 438/210

(58) Field of Classification Search ........ 438/238, 438/199, 210, 202, 200
See application file for complete search history.

(56) References Cited

U.S. PATENT DOCUMENTS

| 4,609,835 | A | * | 9/1986 | Sakai et al. ............... 326/102 |
| 4,805,008 | A |   | 2/1989 | Yao et al. |
| 5,298,782 | A |   | 3/1994 | Sundaresan |
| 5,406,513 | A |   | 4/1995 | Canaris et al. |
| 5,506,166 | A |   | 4/1996 | Sandhu et al. |
| 5,721,445 | A |   | 2/1998 | Singh et al. |
| 5,804,477 | A |   | 9/1998 | Lien |
| 5,892,263 | A |   | 4/1999 | Tachiyama |
| 5,896,313 | A |   | 4/1999 | Kao et al. |
| 6,005,797 | A |   | 12/1999 | Porter et al. |
| 6,187,618 | B1 | * | 2/2001 | Kao et al. ............... 438/202 |
| 6,376,297 | B1 |   | 4/2002 | Porter et al. |
| 6,642,588 | B1 |   | 11/2003 | Porter et al. |
| 6,767,784 | B1 |   | 7/2004 | Porter et al. |

* cited by examiner

Primary Examiner—Michael Trinh
(74) Attorney, Agent, or Firm—Dinsmore & Shohl LLP

(57) ABSTRACT

An SRAM memory cell is provided having a pair of cross-coupled CMOS inverters. The sources of the pull-up transistors forming each of the CMOS inverters are coupled to $V_{CC}$ through parasitic resistance of the substrate in which each is formed. The source of the p-type pull-up transistor is therefore always at a potential less than or equal to the potential of the N-well such that the emitter-base junction of the parasitic PNP transistor cannot become forward biased and latch-up cannot occur.

20 Claims, 6 Drawing Sheets

LATCH-UP PREVENTION FOR MEMORY CELLS

CROSS-REFERENCE TO RELATED APPLICATIONS

This application is a division of application Ser. No. 09/740,174 filed Dec. 18, 2000, now U.S. Pat. No. 6,767,784 issued Jul. 27, 2004 entitled "LATCH-UP PREVENTION FOR MEMORY CELLS", which is a division of application Ser. No. 09/368,710, filed Aug. 5, 1999, now U.S. Pat. No. 6,376,297, issued Apr. 23, 2002 and entitled "LATCH-UP PREVENTION FOR MEMORY CELLS", which is a division of application Ser. No. 09/045,465 filed Mar. 20, 1998, now U.S. Pat. No. 6,005,797, issued Dec. 21, 1999 and entitled "LATCH-UP PREVENTION FOR MEMORY CELLS".

This application is also related to U.S. patent application Ser. No. 09/620,055, filed Jul. 20, 2000, now U.S. Pat. No. 6,642,588 B1, issued Nov. 4, 2003 and entitled "LATCH-UP PREVENTION FOR MEMORY CELLS", which application is a continuation of U.S. patent application Ser. No. 09/368,710, filed Aug. 5, 1999, now U.S. Pat. No. 6,376,297, issued Apr. 23, 2002 and entitled "LATCH-UP PREVENTION FOR MEMORY CELLS".

BACKGROUND OF THE INVENTION

The present invention relates in general to a static random access memory (SRAM), and, more particularly, to an SRAM having improved latch-up characteristics.

RAM chips are well known in the art. An SRAM chip is conventionally structured in rows and columns of individual SRAM cells. A prior art six transistor CMOS SRAM cell 1 is shown schematically in FIG. 1. The SRAM cell 1 includes two n-type access transistors 5, 6, two p-type pull-up transistors 7, 8 acting as load devices, and two n-type pull-down transistors 9, 10, with the pull-transistors 7,8 and pull-down transistors 9, 10 forming two CMOS inverters. The SRAM cell 1 has two states: logic state "0" and logic state "1". By convention, if logic state "0" is designated by node A having a high voltage and node B having a low voltage, then logic state "1" has the opposite stored voltages, i.e., node A having a low voltage and node B having a high voltage.

In logic state "0" the high voltage on node A turns on the pull-down transistor 9 and turns off the pull-up transistor 7, whereas the low voltage on node B turns off the pull-down transistor 10 and turns on the pull-up transistor 8. Because the pull-down transistor 9 is on and the pull-up transistor 7 is off, current flows through the pull-down transistor 9 to a voltage supply $V_{SS}$ (ground), thereby maintaining a low voltage on node B. Because the pull-up transistor 8 is turned on and the pull-down transistor 10 is turned off, current flows from a voltage supply $V_{CC}$ through the pull-up transistor 8, thereby maintaining a high voltage on node A.

To change the state of the SRAM cell 1 from a logic "0" to a logic "1", a column line 3 and a column line complement 2 are provided with a low and a high voltage, respectively. Then, the access transistors 5 and 6 are turned on by a high voltage on a row line 4, thereby providing the low voltage on the column line 3 to node A and the high voltage on the column line complement 2 to node B. Accordingly, the pull-down transistor 9 is turned off and the pull-up transistor 7 is turned on by the low voltage on node A and the pull-down transistor 10 is turned on and the pull-up transistor 8 is turned off by the high voltage on node B, thereby switching the state of the circuit from logic "0" to logic "1". Following the switching of the state of the SRAM cell 1, the access transistors 5 and 6 are turned off (by applying a low voltage on row line 4). The SRAM cell 1 maintains its new logic state in a manner analogous to that described above.

FIGS. 2A and 2B are a schematic diagram and cross-section, respectively, of one of the CMOS inverters of FIG. 1 illustrating parasitic transistors and resistors of the inverter. As shown in FIG. 2B, the pull-down transistor 9 is formed within a P-type substrate 12 while the pull-up transistor 7 is formed within an N-well 14. The N-well 14 is formed within the P-type substrate 12. The N-well 14 includes parasitic resistance denoted by the resistor 16 and the P-type substrate includes parasitic resistance denoted by the resistor 18. The configuration of the pull-down transistor 9 and the pull-up transistor 7 results in the existence of a PNP parasitic bipolar transistor 20 and an NPN parasitic bipolar transistor 22.

With the tight layout spacings that exist in a typical memory array, leakage currents from the N-well 14 and the P-type substrate 12 are possible. These leakage currents produce a voltage drop across the parasitic resistor 16. If the voltage drop becomes sufficiently large, it can result in the parasitic PNP transistor 20 turning on and conducting current from the P+ region forming its emitter to the P-type substrate 12 that forms its collector. The P-type substrate 12 also forms the base terminal of the parasitic NPN transistor 22 and one terminal of the parasitic resistor 18. The other terminal of the parasitic resistor 18 is the substrate tie-down represented by $V_{BB}$. The current flowing through the resistor 18 produces a voltage rise at the point of injection. If this voltage rise becomes sufficiently large, it can result in the NPN transistor 22 turning on causing additional current to be drawn out the N-well 14 as collector current for the NPN transistor 22. This additional current reinforces the original leakage from the N-well 14 turning the PNP transistor 20 on even harder providing added base current for the NPN transistor 22. This feedback loop can result in a latch-up problem within the memory array containing the SRAM cell.

Accordingly, there is a need for an improved SRAM memory cell that is not prone to latch-up.

SUMMARY OF THE INVENTION

The present invention meets this need by providing an SRAM memory cell in which the source of the p-type pull-up transistor is coupled to $V_{CC}$ through the parasitic resistance of the N-well in which it is formed. The source of the p-type pull-up transistor is therefore always at a potential less than or equal to the potential of the N-well such that the emitter-base junction of the parasitic PNP transistor cannot become forward biased and latch-up cannot occur.

According to a first aspect of the present invention, an SRAM memory cell is provided comprising a first pull-up transistor having a first substrate, a first source, a first gate coupled to a first node, and a first drain coupled to a second node. The first source is coupled to a first voltage input through parasitic resistance of the first substrate. A first pull-down transistor is provided having a second drain coupled to the second node, a second gate coupled to the first node, and a second source coupled to a second voltage source. An input line is coupled to the first node for providing a signal to the memory cell to change the memory cell from a first logic state to a second logic state. The input line may comprise an access transistor having one terminal coupled to the first node, another terminal coupled to a column line, and an access gate coupled to a row line.

According to another aspect of the present invention, an SRAM memory cell is provided comprising a first pull-up transistor, a first pull down transistor, a second pull-up transistor, a second pull-down transistor, and an input line. The first pull-up transistor includes a first substrate, a first source, a first gate coupled to a first node, and a first drain coupled to a second node. The first pull-down transistor includes a second drain coupled to the second node, a second gate coupled to the first node, and a second source coupled to a second voltage input. The second pull-up transistor includes a second substrate, a third source, a third gate coupled to the second node, and a third drain coupled to the first node. The second pull-down transistor includes a fourth drain coupled to the first node, a fourth gate coupled to the second node, and a fourth source coupled to the second voltage input. The first source is coupled to a first voltage input through parasitic resistance of the first substrate while the third source is coupled to the first voltage input through parasitic resistance of the second substrate. The input line is coupled to the first and second nodes for providing a signal to the memory cell to change the memory cell from a first logic state to a second logic state. Preferably, the first substrate and the second substrate are portions of a single substrate.

According to yet another aspect of the present invention, an SRAM memory cell is provided comprising a substrate assembly having at least one semiconductor layer, and a first semiconductor structure formed within the at least one semiconductor layer with the first semiconductor structure being coupled to a first voltage input. A first pull-up transistor is formed in the first semiconductor structure and comprises a first gate, a first source and a first drain. The first source is coupled to the first semiconductor structure such that the first source is coupled to the first voltage input through parasitic resistance of the semiconductor structure. A first pull-down transistor is formed in the at least one semiconductor layer and comprises a second gate coupled to the first gate, a second source coupled to a second voltage input, and a second drain coupled to the first drain.

The memory cell may further comprise an access transistor formed in the at least one semiconductor layer having one terminal coupled to the first and second drains, another terminal coupled to a column line and an access gate coupled to a row line. Preferably, the at least one semiconductor layer comprises P-type semiconductor material and the semiconductor structure comprises an N-type well According to a further aspect of the present invention, an SRAM memory cell comprises a substrate assembly having at least one semiconductor layer, and a first semiconductor structure and a second semiconductor structure formed within the at least one semiconductor layer with the first and second semiconductor structures being coupled to a first voltage input. A first pull-up transistor is formed in the first semiconductor structure and comprises a first gate, a first source and a first drain with the first source being coupled to the first semiconductor structure such that the first source is coupled to the first voltage input through parasitic resistance of the first semiconductor structure. A first pull-down transistor is formed in the at least one semiconductor layer and comprises a second gate coupled to the first gate, a second source coupled to a second voltage input, and a second drain coupled to the first drain. A second pull-up transistor is formed in the second semiconductor structure and comprises a third gate, a third source and a third drain with the third source being coupled to the second semiconductor structure such that the third source is coupled to the first voltage input through parasitic resistance of the second semiconductor structure. A second pull-down transistor is formed in the at least one semiconductor layer and comprises a fourth gate coupled to the third gate, a fourth source coupled to the second voltage input, and a fourth drain coupled to the third drain.

Preferably, the at least one semiconductor layer comprises P-type semiconductor material while the first and second semiconductor structures each comprise an N-type well. The first semiconductor structure and the second semiconductor structure may form portions of a single semiconductor structure. The memory cell may further comprise a first access transistor formed in the at least one semiconductor layer having a first terminal coupled to the first and second drains, a second terminal coupled to a first column line and a first access gate coupled to a row line, and a second access transistor formed in the at least one semiconductor layer having a third terminal coupled to the third and fourth drains, a fourth terminal coupled to a second column line and a second access gate coupled to the row line.

According to a still further aspect of the present invention an SRAM memory array is provided comprises a plurality of memory cells arranged in rows and columns. Each of the memory cells comprise a first pull-up transistor, a first pull-down transistor, a second pull-up transistor, a second pull-down transistor, a first access transistor and a second access transistor. The first pull-up transistor includes a first substrate, a first source, a first gate coupled to a first node, and a first drain coupled to a second node with the first source being coupled to a first voltage input through parasitic resistance of the first substrate. The first pull-down transistor includes a second drain coupled to the second node, a second gate coupled to the first node, and a second source coupled to a second voltage input. The second pull-up transistor includes a second substrate, a third source, a third gate coupled to the second node, and a third drain coupled to the first node with the third source being coupled to the first voltage input through parasitic resistance of the second substrate. The second pull-down transistor includes a fourth drain coupled to the first node, a fourth gate coupled to the second node, and a fourth source coupled to the second voltage input. The first access transistor includes a first terminal coupled to the first and second drains, a second terminal coupled to a first column line and a first access gate coupled to a row line. The second access transistor includes a third terminal coupled to the third and fourth drains, a fourth terminal coupled to a second column line and a second access gate coupled to the row line. The memory array also includes a memory decoder coupled to the plurality of memory cells for accessing each of the plurality of memory cells via the respective ones of a plurality of the row lines and respective ones of a plurality of the first and second column lines.

Preferably, the first substrate and the second substrate form portions of a single substrate. The memory array may comprise a plurality of the rows with each of the first and second pull-up transistors making up each of the rows of memory cells sharing a common substrate.

According to yet another aspect of the present invention, an SRAM memory array is provided comprising a plurality of SRAM memory cells arranged in rows and columns and formed on a substrate assembly comprises at least one semiconductor layer. Each of the plurality of memory cells comprise a first semiconductor structure and a second semiconductor structure formed within the at least one semiconductor layer with the first and second semiconductor structures is coupled to a first voltage input. A first pull-up transistor is formed in the first semiconductor structure and comprises a first gate, a first source and a first drain with the first source being coupled to the first semiconductor structure such that the first source is coupled to the first voltage input through parasitic resistance of the first semiconductor structure. A first pull-down transistor is formed in the at least one semiconductor layer and comprises a second gate coupled to the first gate, a second source coupled to a second voltage input, and a second drain coupled to the first drain. A second pull-up transistor is formed in the second semiconductor structure and comprises a third gate, a third source and a third drain with the third source being coupled to the second semiconductor structure such that the third source is coupled to the first voltage input through parasitic resistance of the second semiconductor structure. A second pull-down transistor is formed in the at least one semiconductor layer and comprises a fourth gate coupled to the third gate, a fourth source coupled to the second voltage input, and a fourth drain coupled to the third drain. A first access transistor is formed in the at least one semiconductor layer and includes a first terminal coupled to the first and second drains, a second terminal coupled to a first column line and a first access gate coupled to a row line. A second access transistor is formed in the at least one semiconductor layer and includes a third terminal coupled to the third and fourth drains, a fourth terminal coupled to a second column line and a first access gate coupled to a row line. The memory array includes a memory decoder coupled to the plurality of memory cells for accessing each of the plurality of memory cells via respective ones of a plurality of the row lines and respective ones of a plurality of the first and second column lines.

Preferably, the first substrate and the second substrate form portions of a single substrate. The at least one semiconductor layer may comprise P-type semiconductor material while the first semiconductor structure may comprise an N-type well. The memory array may comprise a plurality of the rows with each of the first and second pull-up transistors making up each of the rows of memory cells sharing the N-type well.

According to yet another aspect of the present invention, a computer system is provided comprising an SRAM memory array and a microprocessor. The memory array comprises a plurality of memory cells arranged in rows and columns with each of the memory cells comprising a first pull-up transistor, a first pull-down transistor, a second pull-up transistor, a second pull-down transistor, a first access transistor and a second access transistor. The first pull-up transistor includes a first substrate, a first source, a first gate coupled to a first node, and a first drain coupled to a second node with the first source being coupled to a first voltage input through parasitic resistance of the first substrate. The first pull-down transistor includes a second drain coupled to the second node, a second gate coupled to the first node, and a second source coupled to a second voltage input. The second pull-up transistor includes a second substrate, a third source, a third gate coupled to the second node, and a third drain coupled to the first node with the third source being coupled to the first voltage input through parasitic resistance of the second substrate. The second pull-down transistor includes a fourth drain coupled to the first node, a fourth gate coupled to the second node, and a fourth source coupled to the second voltage input. The first access transistor includes a first terminal coupled to the first and second drains, a second terminal coupled to a first column line and a first access gate coupled to a row line. The second access transistor includes a third terminal coupled to the third and fourth drains, a fourth terminal coupled to a second column line and a second access gate coupled to the row line. The memory array also includes a memory decoder coupled to the plurality of memory cells for accessing each of the plurality of memory cells via the respective ones of a plurality of the row lines and respective ones of a plurality of the first and second column lines. The microprocessor communicates with each of the plurality of memory cells via the memory decoder.

According to a further aspect of the present invention, a computer system is provided comprising a SRAM memory array and a microprocessor. The memory array comprises a plurality of memory cells arranged in rows and columns and formed on a substrate assembly comprises at least one semiconductor layer. Each of the plurality of memory cells comprise a first semiconductor structure and a second semiconductor structure formed within the at least one semiconductor layer with the first and second semiconductor structures is coupled to a first voltage input. A first pull-up transistor is formed in the first semiconductor structure and comprises a first gate, a first source and a first drain with the first source being coupled to the first semiconductor structure such that the first source is coupled to the first voltage input through parasitic resistance of the first semiconductor structure. A first pull-down transistor is formed in the at least one semiconductor layer and comprises a second gate coupled to the first gate, a second source coupled to a second voltage input, and a second drain coupled to the first drain. A second pull-up transistor is formed in the second semiconductor structure and comprises a third gate, a third source and a third drain with the third source being coupled to the second semiconductor structure such that the third source is coupled to the first voltage input through parasitic resistance of the second semiconductor structure. A second pull-down transistor is formed in the at least one semiconductor layer and comprises a fourth gate coupled to the third gate, a fourth source coupled to the second voltage input, and a fourth drain coupled to the third drain. A first access transistor is formed in the at least one semiconductor layer and includes a first terminal coupled to the first and second drains, a second terminal coupled to a first column line and a first access gate coupled to a row line. A second access transistor is formed in the at least one semiconductor layer and includes a third terminal coupled to the third and fourth drains, a fourth terminal coupled to a second column line and a first access gate coupled to a row line. The memory array includes a memory decoder coupled to the plurality of memory cells for accessing each of the plurality of memory cells via respective ones of a plurality of the row lines and respective ones of a plurality of the first and second column lines. The microprocessor communicates with each of the plurality of memory cells via the memory decoder.

According to a still further aspect of the present invention, a method of fabricating an SRAM memory cell is provided. A substrate assembly having at least one semiconductor layer is provided. A first semiconductor structure is formed within the at least one semiconductor layer. A first source and a first drain of a first pull-up transistor are formed in the first semiconductor structure. A second source and a second drain of a first pull-down transistor are formed in the at least one semiconductor layer. A first contact and a second contact are formed within the first semiconductor structure. A first gate for the first pull-up transistor and a second gate for the first pull-down transistor are formed. The first drain is coupled to the second drain and the first gate is coupled to the second gate. The first source is coupled to one of the first and second contacts such that with the other of the first and second contacts coupled to a first voltage input the first source is coupled to the first voltage input through parasitic resistance of the first semiconductor structure.

According to another aspect of the present invention, a method of fabricating an SRAM memory cell is provided. A substrate assembly having at least one semiconductor layer is provided. A first semiconductor structure and a second semiconductor structure are formed within the at least one semiconductor layer. A first source and a first drain of a first pull-up transistor are formed in the first semiconductor structure. A second source and a second drain of a first pull-down transistor are formed in the at least one semiconductor layer. A third source and a third drain of a second pull-up transistor are formed in the second semiconductor structure. A fourth source and a fourth drain of a second pull-down transistor are formed in the at least one semiconductor layer. A first contact and a second contact are formed within the first semiconductor structure. A third contact and fourth contact are formed within the second semiconductor structure. A first gate for the first pull-up transistor, a second gate for the first pull-down transistor, a third gate for the second pull-up transistor and a fourth gate for the second pull-down transistor are formed. The first drain is coupled to the second drain and the third drain is coupled to the fourth drain. The first gate is coupled to the second gate and the third gate is coupled to the fourth gate. The first source is coupled to one of the first and second contacts such that with the other of the first and second contacts coupled to a first voltage input the first source is coupled to the first voltage input through parasitic resistance of the first semiconductor structure. The third source is coupled to one of the third and fourth contacts such that with the other of the third and fourth contacts coupled to the first voltage input the third source is coupled to the first voltage input through parasitic resistance of the second semiconductor structure.

Preferably, the first substrate and the second substrate form portions of a single substrate. The at least one semiconductor layer may comprise P-type semiconductor material while the first semiconductor structure may comprise an N-type well.

According to yet another aspect of the present invention, a method of fabricating an SRAM memory array is provided. A substrate assembly having at least one semiconductor layer is provided. A plurality of memory cells arranged in rows and columns are formed. Each of the plurality of memory cells are fabricated according to the following steps. A first semiconductor structure is formed within the at least one semiconductor layer. A second semiconductor structure is formed within the at least one semiconductor layer. A first source and a first drain of a first pull-up transistor are formed in the first semiconductor structure. A second source and a second drain of a first pull-down transistor are formed in the at least one semiconductor layer. A third source and a third drain of a second pull-up transistor are formed in the second semiconductor structure. A fourth source and a fourth drain of a second pull-down transistor are formed in the at least one semiconductor layer. A first terminal and a second terminal of a first access transistor are formed in the at least one semiconductor layer. A third terminal and a fourth terminal of a second access transistor are formed in the at least one semiconductor layer. A first contact and a second contact are formed within the first semiconductor structure. A third contact and fourth contact are formed within the second semiconductor structure. A first gate for the first pull-up transistor, a second gate for the first pull-down transistor, a third gate for the second pull-up transistor, a fourth gate for the second pull-down transistor, a first access gate for the first access transistor, and a second access gate for the second access transistor are formed. The first drain is coupled to the second drain and the third drain is coupled to the fourth drain. The first gate is coupled to the second gate and the third gate is coupled to the fourth gate. The first terminal is coupled to the first and second drains and the third terminal is coupled to the third and fourth drains. The first source is coupled to one of the first and second contacts such that with the other of the first and second contacts coupled to a first voltage input the first source is coupled to the first voltage input through parasitic resistance of the first semiconductor structure. The third source is coupled to one of the third and fourth contacts such that with the other of the third and fourth contacts coupled to the first voltage input the third source is coupled to the first voltage input through parasitic resistance of the second semiconductor structure. The first and second access gates of each of the plurality of memory cells are coupled to respective row lines. The second terminals of each of the plurality of memory cells are coupled to respective first column lines. The fourth terminals of each of the plurality of memory cells are coupled to respective second column lines.

Preferably, the first substrate and the second substrate form portions of a single substrate. Each of the first and second pull-up transistors making up each of the rows of memory cells may share the N-type well.

According to a still further aspect of the present invention, a method of fabricating a computer system is provided. A memory array and a microprocessor are provided. The memory array comprises a plurality of memory cells arranged in rows and columns and formed on a substrate assembly comprising at least one semiconductor layer. Each of the plurality of memory cells comprise a first semiconductor structure and a second semiconductor structure formed within the at least one semiconductor layer with the first and second semiconductor structures is coupled to a first voltage input. A first pull-up transistor is formed in the first semiconductor structure and comprises a first gate, a first source and a first drain with the first source being coupled to the first semiconductor structure such that the first source is coupled to the first voltage input through parasitic resistance of the first semiconductor structure. A first pull-down transistor is formed in the at least one semiconductor layer and comprises a second gate coupled to the first gate, a second source coupled to a second voltage input, and a second drain coupled to the first drain. A second pull-up transistor is formed in the second semiconductor structure and comprises a third gate, a third source and a third drain with the third source being coupled to the second semiconductor structure such that the third source is coupled to the first voltage input through parasitic resistance of the second semiconductor structure. A second pull-down transistor is formed in the at least one semiconductor layer and comprises a fourth gate coupled to the third gate, a fourth source coupled to the second voltage input, and a fourth drain coupled to the third drain. A first access transistor is formed in the at least one semiconductor layer and includes a first terminal coupled to the first and second drains, a second terminal coupled to a first column line and a first access gate coupled to a row line. A second access transistor is formed in the at least one semiconductor layer and includes a third terminal coupled to the third and fourth drains, a fourth terminal coupled to a second column line and a first access gate coupled to a row line. The memory array includes a memory decoder coupled to the plurality of memory cells for accessing each of the plurality of memory cells via respective ones of a plurality of the row lines and respective ones of a plurality of the first and second column lines. The microprocessor communicates with each of the plurality of memory cells via the memory decoder.

Accordingly, it is an object of the present invention to provide an improved SRAM that is not prone to latch up; and, to provide an improved SRAM memory cell wherein parasitic resistance is used to couple $V_{CC}$ to pull-up transistors to prevent latch-up of the memory cell. Other features and advantages of the invention will be apparent from the following description, the accompanying drawings and the appended claims.

DETAILED DESCRIPTION OF THE PREFERRED EMBODIMENTS

Figure 1:
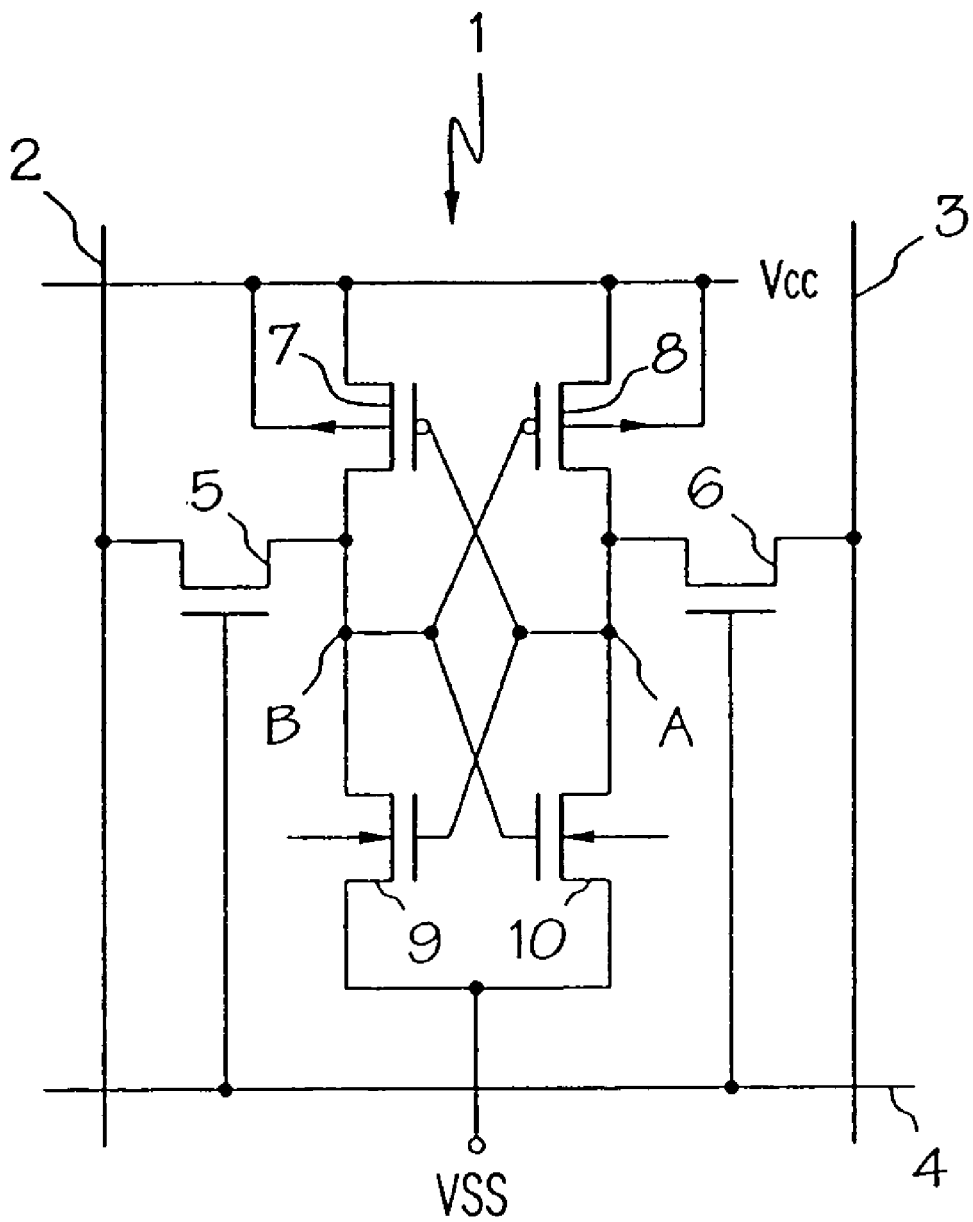
FIG. 1 illustrates a prior art six transistor SRAM memory cell.
Figure 2A:
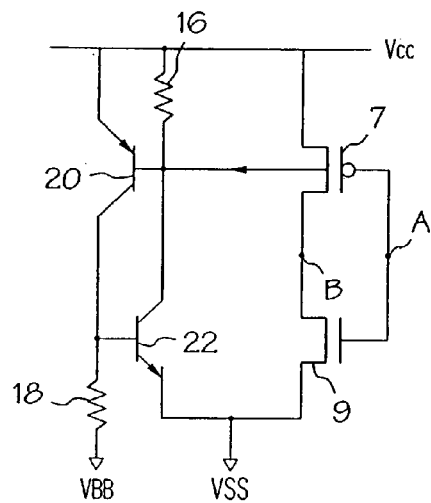
FIG. 2A illustrates one of the inverters of the SRAM memory cell of FIG. 1 along with the corresponding parasitic transistors and resistors.
Figure 2B:
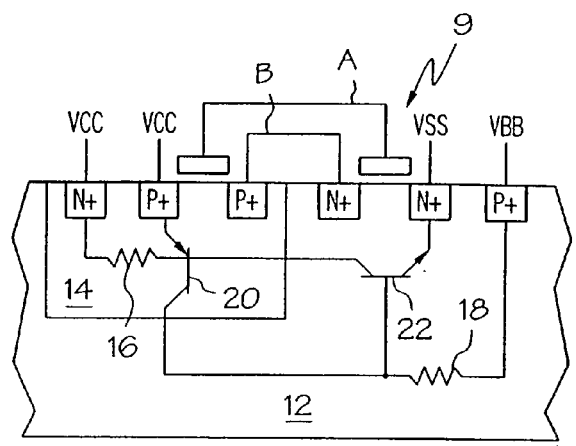
FIG. 2B is an enlarged, sectioned side view depicting the inverter and parasitic transistors and resistors of FIG. 2A.
Figure 3:
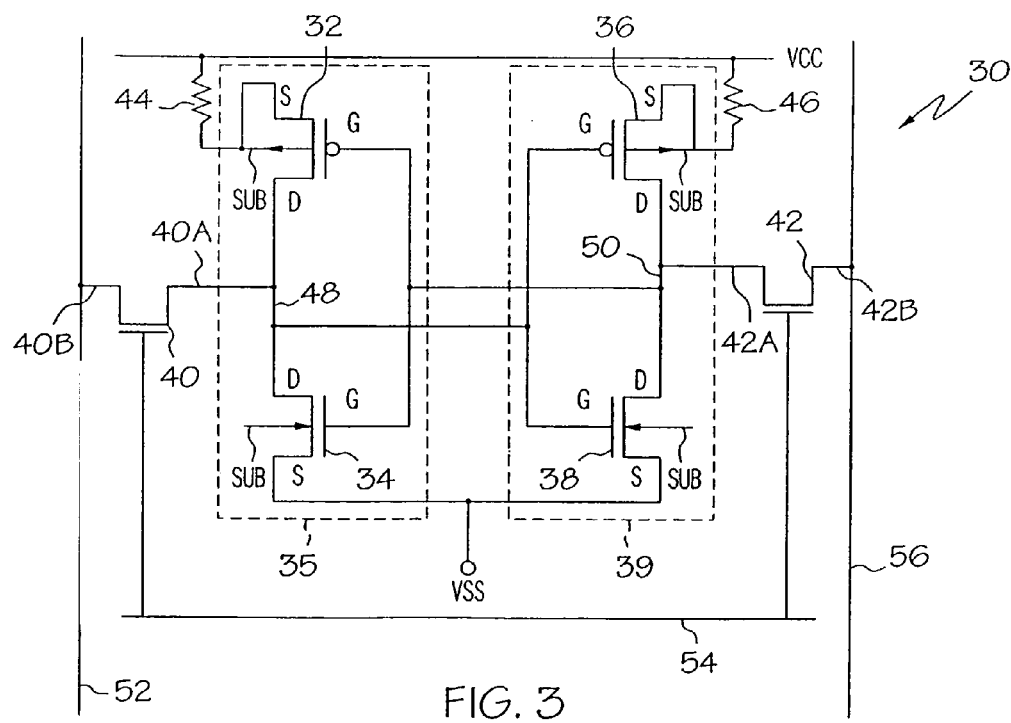
FIG. 3 illustrates schematically an SRAM memory cell in accordance with the present invention.

FIG. 3 illustrates schematically an SRAM memory cell 30 in accordance with the present invention. The SRAM memory cell 30 includes a first MOS (p-type) pull-up transistor 32, a first MOS (n-type) pull-down transistor 34, a second MOS (p-type) pull-up transistor 36, a second MOS (n-type) pull-down transistor 38, a third MOS or first access transistor 40 and a fourth MOS or second access transistor 42. The MOS transistors 32, 34, 36 and 38 each include a drain (D), a gate (G) and a source (S) as illustrated in FIG. 3 with the first pull-up transistor 32 having a first drain 32D, a first source 32S and a first gate 32G, the first pull-down transistor 34 having a second drain 34D, a second source 34S and a second gate 34G, the second pull-up transistor 36 having a third drain 36D, a third source 36S and a third gate 36G and the second pull-down transistor 38 having a fourth drain 38D, a fourth source 38S and a fourth gate 38G, see FIGS. 4A, 4B and 5.

It will be appreciated by those skilled in the art that the drain and source terminals of a MOS transistor are typically identical with the drain/source label being applied for descriptive purposes once a voltage is applied to the transistor. For n-type transistors, the drain designation is applied to the terminal having the higher voltage potential with the source designation being applied to the other terminal. Accordingly, separate drain/source designations have not been applied to the access transistors 40 and 42 as voltages across the drain/source terminals change in such a manner as to cause corresponding changes in drain/source designations for the access transistors 40 and 42. The drains and sources of the first and second access transistors 40 and 42 will be described as first terminals 40A, 42A and second terminals 40B, 42B for descriptive purposes herein.

Each of the MOS transistors 32, 34, 36 and 38 have substrate terminals SUB corresponding to the semiconductor substrates in which the transistors are formed. The substrates of the pull-up transistors 32 and 36 are coupled to a first voltage input $V_{CC}$. The sources 32S, 36S of the pull-up transistors 32 and 36 are coupled to their corresponding substrates such that the sources are coupled to the first voltage input $V_{CC}$ through the parasitic resistance of each substrate represented by resistors 44 and 46. The drains 32D, 36D of the pull-up transistors 32 and 36 are coupled to a first node 48 and a second node 50, respectively. The drains 34D, 38D of the pull-down transistors 34 and 38 are coupled to the first node 48 and the second node 50, respectively. The sources 34S, 38S of the pull-down transistors 34 and 38 are coupled to a second voltage input or $V_{SS}$. Typically, $V_{CC}$ is approximately 5.0 volts to 2.0 volts, depending on the process and technology, while $V_{SS}$ is approximately zero volts or ground.

The transistors 32, 34, 36 and 38 form a pair of cross-coupled CMOS inverters with transistors 32 and 34 configured as a first CMOS inverter 35 and transistors 36 and 38 configured as a second CMOS inverter 39. The pull-down transistors 34 and 38 are cross-coupled with the drain 34D of the first pull-down transistor 34 being coupled to the gate 38G of the second pull-down transistor 38 and the drain 38D of the second pull-down transistor 38 being coupled to the gate 34G of the first pull-down transistor 34. For illustrative purposes, it is assumed that logic state "0" is designated by node 48 having a low voltage and node 50 having a high voltage while logic state "1" is designated by node 48 having a high voltage and node 50 having a low voltage.

In logic state "0" the high voltage on node 50 turns on the first pull-down transistor 34 and turns off the first pull-up transistor 32, whereas the low voltage on node 48 turns off the second pull-down transistor 38 and turns on the second pull-up transistor 36. Because the first pull-down transistor 34 is on and the first pull-up transistor 32 is off, current flows through the first pull-down transistor 34 to the second voltage input $V_{SS}$, thereby maintaining a low voltage on node 48. Because the second pull-up transistor 36 is turned on and the second pull-down transistor 38 is turned off, current flows from the first voltage input $V_{CC}$ through the second pull-up transistor 36, thereby maintaining a high voltage on node 50. It should be apparent that for logic state "1," the on/off states of the transistors are reversed with corresponding current flows.

The first terminal 40A of the first access transistor 40 is coupled to the first node 48 while the second terminal 40B is coupled to a first bit or column line 52. The first access gate 40G of the first access transistor 40 is coupled to a word or row line 54. Similarly, the first terminal 42A of the second access transistor 42 is coupled to the second node 50 while the second terminal 42B is coupled to a second bit or column line 56. The second access gate 42G of the second access transistor 42 is coupled to the word or row line 54. Typically, the first and second column lines 52, 56 receive symmetrical data pulses with one of the column lines receiving the complement of the other column line. It should be apparent that the first and second access transistors 40 and 42 function as an input line for providing access to the memory cell 30.

To change the state of the SRAM cell 30 from a logic "0" to a logic "1", the second column line 56 and the first column line 52 are provided with a low and a high voltage, respectively. Then, the access transistors 40 and 42 are turned on by a high voltage on the row line 54, thereby providing the low voltage on the second column line 56 to node 50 and the high voltage on the first column line 52 to node 48. Accordingly, the first pull-down transistor 34 is turned off and the first pull-up transistor 32 is turned on by the low voltage on node 50, and the second pull-down transistor 38 is turned on and the second pull-up transistor 36 is turned off by the high voltage on node 48, thereby switching the state of the circuit from logic "0" to logic "1". Following the switching of the state of the SRAM cell 30, the access transistors 40 and 42 are turned off (by applying a low voltage on row line 54). The SRAM cell 30 maintains its new logic state in a manner analogous to that described above.

Figure 4A:
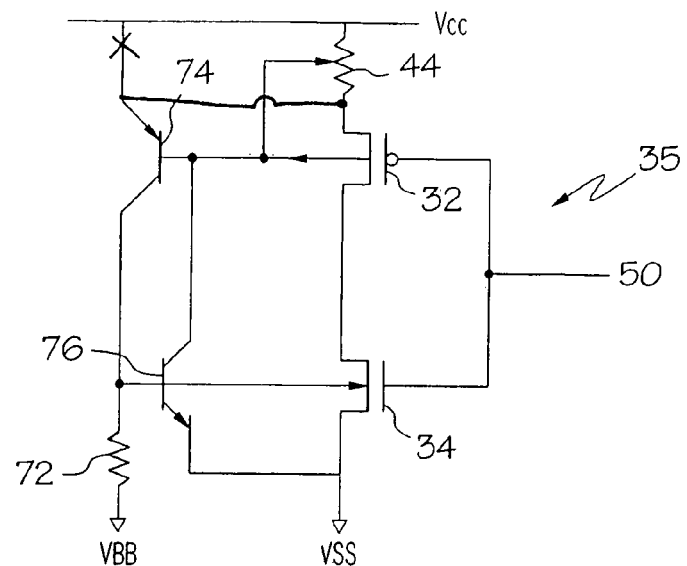
FIG. 4A illustrates one of the inverters of the SRAM memory cell of FIG. 3 along with the corresponding parasitic transistors and resistors.
Figure 4B:
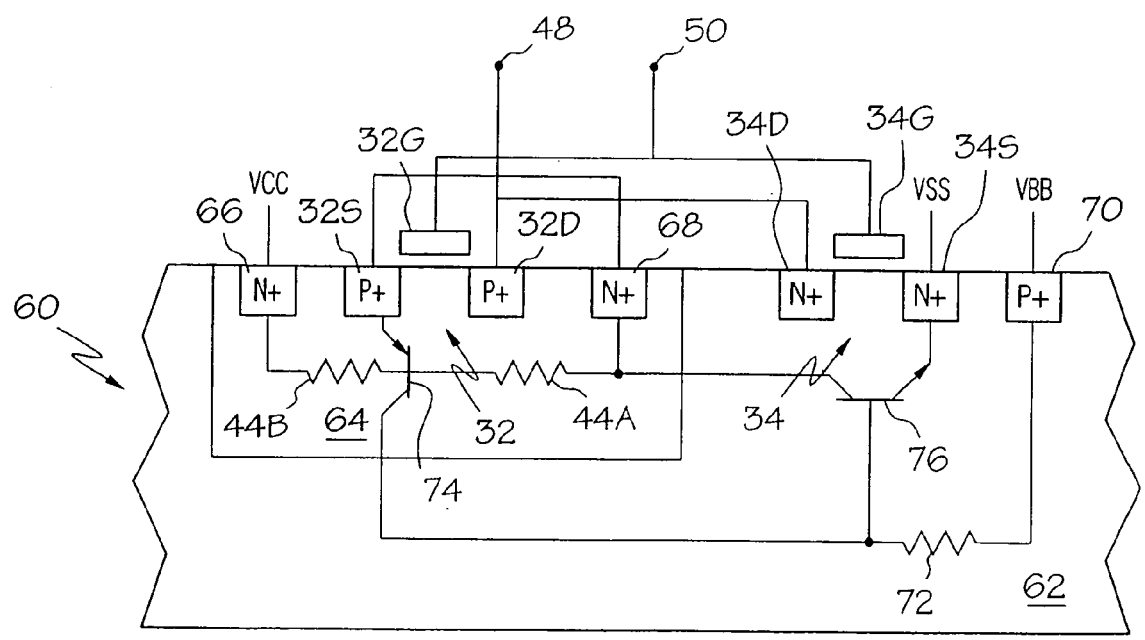
FIG. 4B is an enlarged, sectional side view depicting the inverter and parasitic transistors and resistors of FIG. 4A.

Referring now to FIGS. 4A and 4B, the effect of the parasitic devices resulting from the configuration of the SRAM cell 30 will now be described. A schematic diagram of the first CMOS inverter 35 is illustrated in FIG. 4A with its corresponding parasitic transistors and resistors. It will be appreciated by those skilled in the art that the second inverter 39 includes similar parasitic transistors and resistors. A cross-section of the first CMOS inverter 35 of FIG. 4A is illustrated in FIG. 4B. As shown in FIG. 4B, the first inverter 35, and hence, the memory cell 30, is formed on a substrate assembly 60 comprising a semiconductor layer 62 that is silicon in the illustrated embodiment, and may also include additional layers or structures that define active or operable portions of semiconductor devices (not shown). For example, the semiconductor layer 62 of the substrate assembly 60 may be formed on insulating material, sapphire or another base material.

The semiconductor layer 62 is doped with impurities to form a semiconductor of a first or p-type conductivity. A first semiconductor structure formed within the semiconductor layer 62 is preferably formed of a second or n-type conductivity commonly referred to as an N-well 64. The first pull-down transistor 34 is formed within the semiconductor layer 62 and the first pull-up transistor 32 is formed within the N-well 64.

Buried contacts are formed within the semiconductor layer 62 and the N-well 64 to form the second source 34S and the second drain 34D of the first pull-down transistor 34, and the first source 32S and the first drain 32D of the first pull-up transistor 32. A first contact 66 and a second contact 68 are also formed within the N-well 64 while a first tie-down contact 70 is formed in the semiconductor layer 62. The first gate 32G of the first pull-up transistor 32 and the second gate 34G of the first pull-down transistor 34 are also formed. It should be apparent that the N-well 64 and the semiconductor layer 62 represent the semiconductor substrates in which the transistors 32 and 34 are formed. The first contact 66 and the first tie-down contact 70 are thus used to bias the N-well/first pull-up transistor substrate 64 and the semiconductor layer/first pull-down transistor substrate 62, respectively. It will be appreciated by those skilled in the art that the N-well 64, the buried contacts, and the gates may be formed using processes well known in the art.

Appropriate electrically conductive interconnect layers are formed using processes well known in the art to couple the first gate 32G to the second gate 34G, the first drain 32D to the second drain 34D, and the first source 32S to the second contact 68. Additional electrically conductive interconnect layers are formed to couple the first contact 66 to the first voltage input $V_{CC}$, the second source 34S to the second voltage input $V_{SS}$, and the first tie-down contact 70 to the substrate 62 tie down $V_{BB}$. The N-well 64 includes parasitic resistance denoted by the resistors 44A and 44B while the substrate 62 includes parasitic resistance denoted by the resistor 72. The configuration of the first inverter 35 also results in the existence of a PNP parasitic bipolar transistor 74 and an NPN parasitic bipolar transistor 76.

The parasitic resistor 44 is shown as two resistors 44A and 44B to denote the parasitic resistance between the second contact 68 and the base of the parasitic PNP bipolar transistor 74 and the parasitic resistance between the base of the parasitic PNP bipolar transistor 74 and the first contact 66. The first source 32S is thus coupled to the first voltage input $V_{CC}$ through the combined parasitic resistance of the N-well 64 represented by the parasitic resistors 44A and 44B. The substrate connection of the first pull-up transistor 32 is shown as a variable resistor in FIG. 4A because the resultant parasitic resistance of the N-well 64 varies depending on the distance between the first contact 66 and the first source 32S, i.e., the further the separation the greater the resistance.

As is stated earlier and clearly shown in FIG. 4A and FIG. 4B, the parasitic resistance of the N-well 64 is represented by the parasitic resistor 44 and varies as a function of the separation between the first contact 66 and the second contact 68. The parasitic resistance of the N-well 64 is a combination of a first component and a second component. The first and second components are represented by parasitic resistors 44A and 44 B, respectively. The relative separations of the first contact 66 and the first source 32S and the second contact 68 and the first source 32S of FIG. 4B, show that the first component of the parasitic resistance is at least as large as the second component of the parasitic resistance.

Leakage current from the N-well 64 produces a voltage drop across the parasitic resistor 44A. However, with the first source 32S coupled to the first voltage input $V_{CC}$ through the N-well 64, the first source 32S is always at a potential less than or equal to the potential of the N-well 64. The net result of this configuration is that the emitter-base junction of the parasitic PNP transistor 74 cannot become forward biased and latch-up cannot occur.

Figure 5:
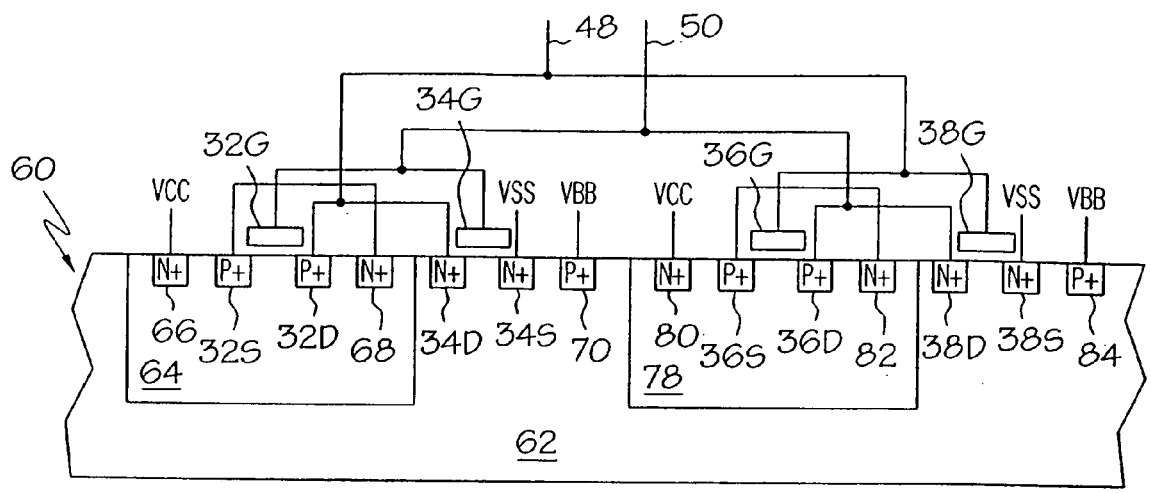
FIG. 5 is an enlarged, sectional side view of the SRAM memory cell of FIG. 3 according to one aspect of the present invention.

Referring now to FIG. 5, the cross-sectional layout of the SRAM memory cell 30 is shown without the parasitic resistors and transistors. The second pull-up transistor 36 is formed within a second semiconductor structure or N-well 78 while the second pull-down transistor 38 is formed within the semiconductor layer 62. Buried contacts are formed within the semiconductor layer 62 and the N-well 78 to form the fourth source 38S and the fourth drain 38D of the second pull-down transistor 38, and the third source 36S and the third drain 36D of the second pull-up transistor 36 using processes well known in the art. A third contact 80 and a fourth contact 82 are also formed within the N-well 78 while a second tie-down contact 84 is formed in the semiconductor layer 62 using processes well known in the art. The third gate 36G of the second pull-up transistor 36 and the fourth gate 38G of the second pull-down transistor 38 are formed using processes well known in the art. It should be apparent that the N-well 78 and the semiconductor layer 62 represent the semiconductor substrates in which the transistors 36 and 38 are formed, respectively. The third contact 80 and the second tie-down contact 84 are thus used to bias the N-well/second pull-up transistor substrate 78 and the semiconductor layer/first pull-down transistor substrate 62, respectively.

Appropriate electrically conductive interconnect layers are formed using processes well known in the art to couple the third gate 36G and the fourth gate 38G to the first drain 32D and the second drain 34D, the third drain 36D and the fourth drain 38D to the first gate 32G and the second gate 34G, and the third source 36S to the fourth contact 82. Additional electrically conductive interconnect layers are formed to coupled the third contact 80 to the first voltage input $V_{CC}$, the fourth source 38S to the second voltage input $V_{SS}$ and the second tie-down contact 84 to the substrate 62 tie down $V_{BB}$. It will be appreciated by those skilled in the art that the first and second pull-down transistors 34 and 38 may be arranged so that only one tie-down contact is needed for the memory cell 30. It will be further appreciated by those skilled in the art that a single N-well may be used to form the first and second pull-up transistors 32 and 36. It will be even further appreciated by those skilled in the art that the first and second pull-up transistors 32 and 36 may be configured to share the same source contact. Accordingly, with the first semiconductor structure or N-well 64 the same as the second semiconductor structure or N-well 78, i.e., forming portions of a single substrate, only one contact would be needed to couple the sources to the N-well and only one contact would be needed to couple the N-well to the first voltage input $V_{CC}$.

Figure 6:
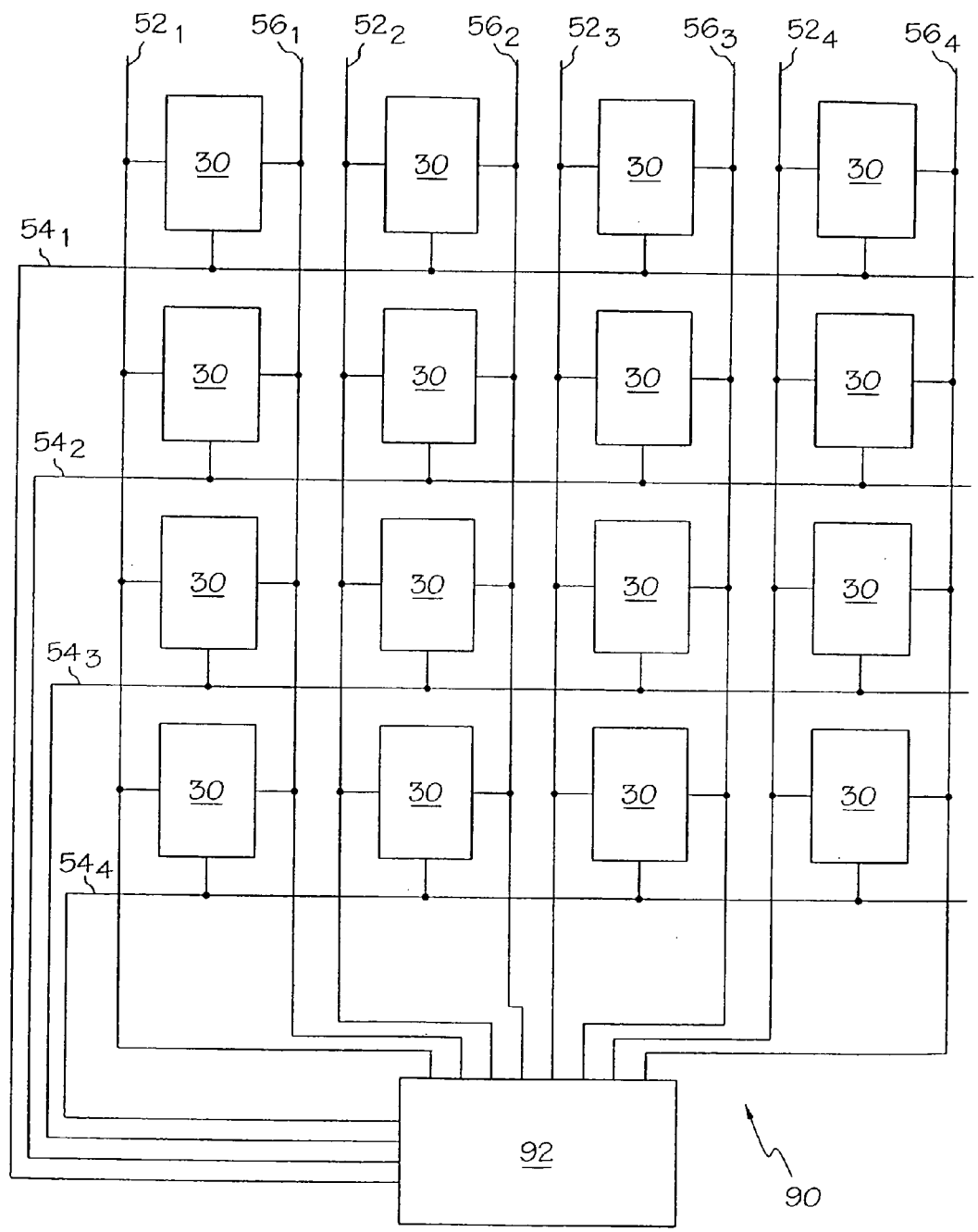
FIG. 6 illustrates schematically an SRAM memory array using the SRAM memory cell of FIG. 3.

Referring now to FIG. 6, it is contemplated by the present invention that the SRAM memory cell 30, described above with respect to FIG. 3, may be utilized to provide an SRAM memory array 90. The SRAM memory array 90 comprises a plurality of SRAM memory cells 30 arranged in a desired number of rows and columns. FIG. 6 depicts an illustrative 16 cell memory array having four (4) rows and four (4) columns. Each of the columns include respective first and second column lines $52_1$–$52_4$, $56_1$–$56_4$ while each of the rows include respective row lines $54_1$–$54_4$. The column and row lines $52_1$–$52_4$, $56_1$–$56_4$ and $54_1$–$54_4$ are coupled to a memory decoder 92. The memory decoder 92 is capable of assessing each of the memory cells 30 through a unique memory command conveyed on the column and row lines $52_1$–$52_4$, $56_1$–$56_4$ and $54_1$–$54_4$.

Figure 7:
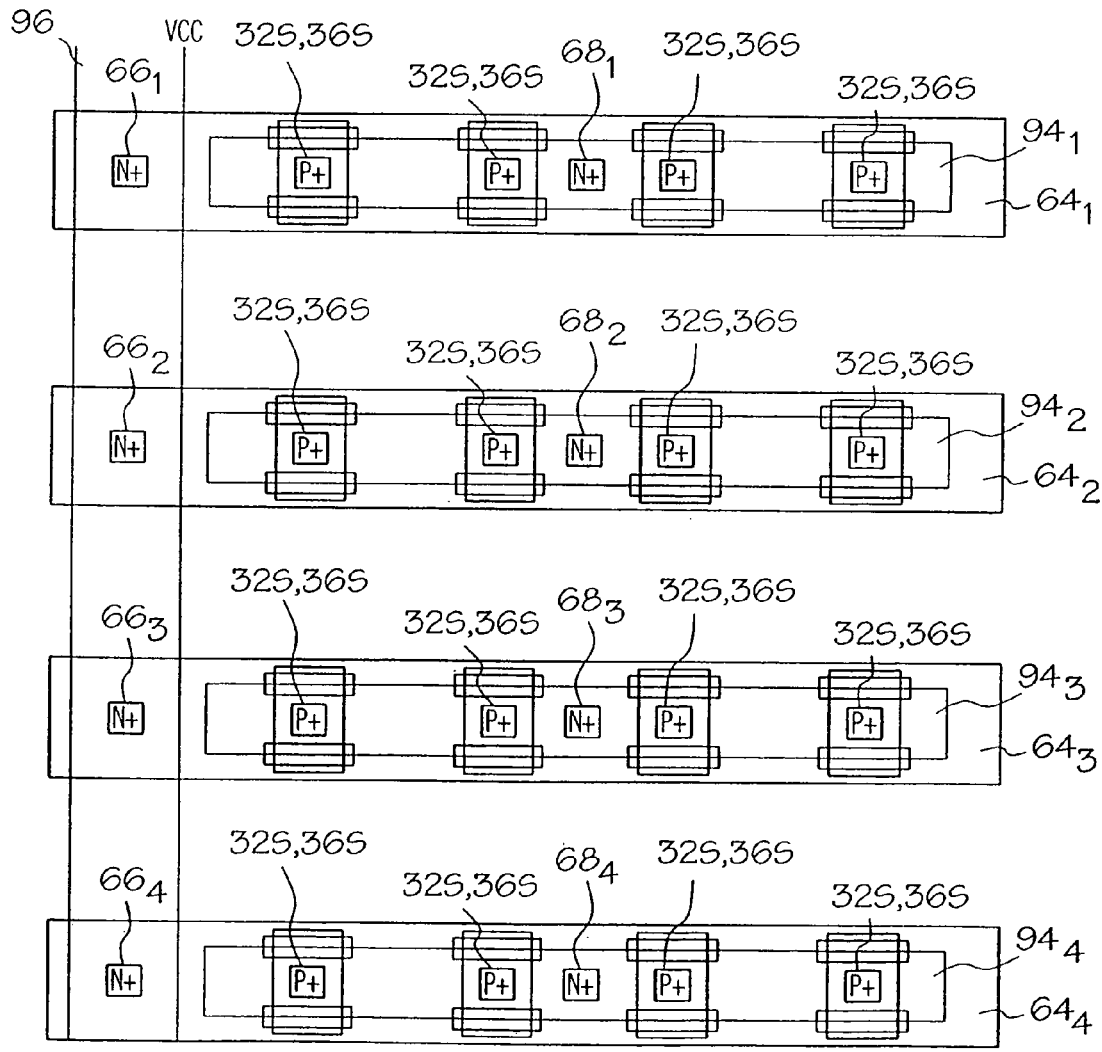
FIG. 7 is a plan view of the layout of the SRAM memory array of FIG. 6 according to another aspect of the present invention.

The first and second pull-up transistors 32 and 36 of the SRAM memory cells 30 making up each row of the memory array 90 are preferably formed within the same N-well as shown in FIG. 7. Four N-wells $64_1$–$64_4$ with each of the first and second pull-up transistors 32 and 36 for each memory cell 30 in each row sharing a respective N-well are shown in FIG. 7. For illustrative purposes, the two horizontal boxes of each cell represent the gate connections for each pull-up transistor 32, 36 while the vertical box represents the active areas for the transistors 32, 36. It will be appreciated by those skilled in the art that the first and second pull-down transistors 34, 38 for each memory cell 30 would be appropriately formed on both sides of the respective N-wells $64_1$–$64_4$.

Each of the sources 32S, 36S are coupled to respective N-well metalization lines $94_1$–$94_4$ with the N-well metalization lines $94_1$–$94_4$ being coupled to at least one $V_{CC}$ metalization line 96 receiving the first voltage input $V_{CC}$. Further, each row includes at least one contact $68_1$–$68_4$ for coupling each respective N-well $64_1$–$64_4$ to the respective N-well metalization line $94_1$–$94_4$, and hence, to the first voltage input $V_{CC}$ through the $V_{CC}$ metalization line 96. In the illustrated embodiment, there is one contact 68 for every four memory cells 30. However, it will be appreciated by those skilled in the art that this four to one ratio may be increased or decreased as appropriate for each particular application. For example, one contact 68 may be sufficient to bias the N-well 64 for every 32 memory cells 30. It will be further appreciated by those skilled in the art that additional $V_{CC}$ metalization lines 96 may be added as appropriate.

Figure 8:
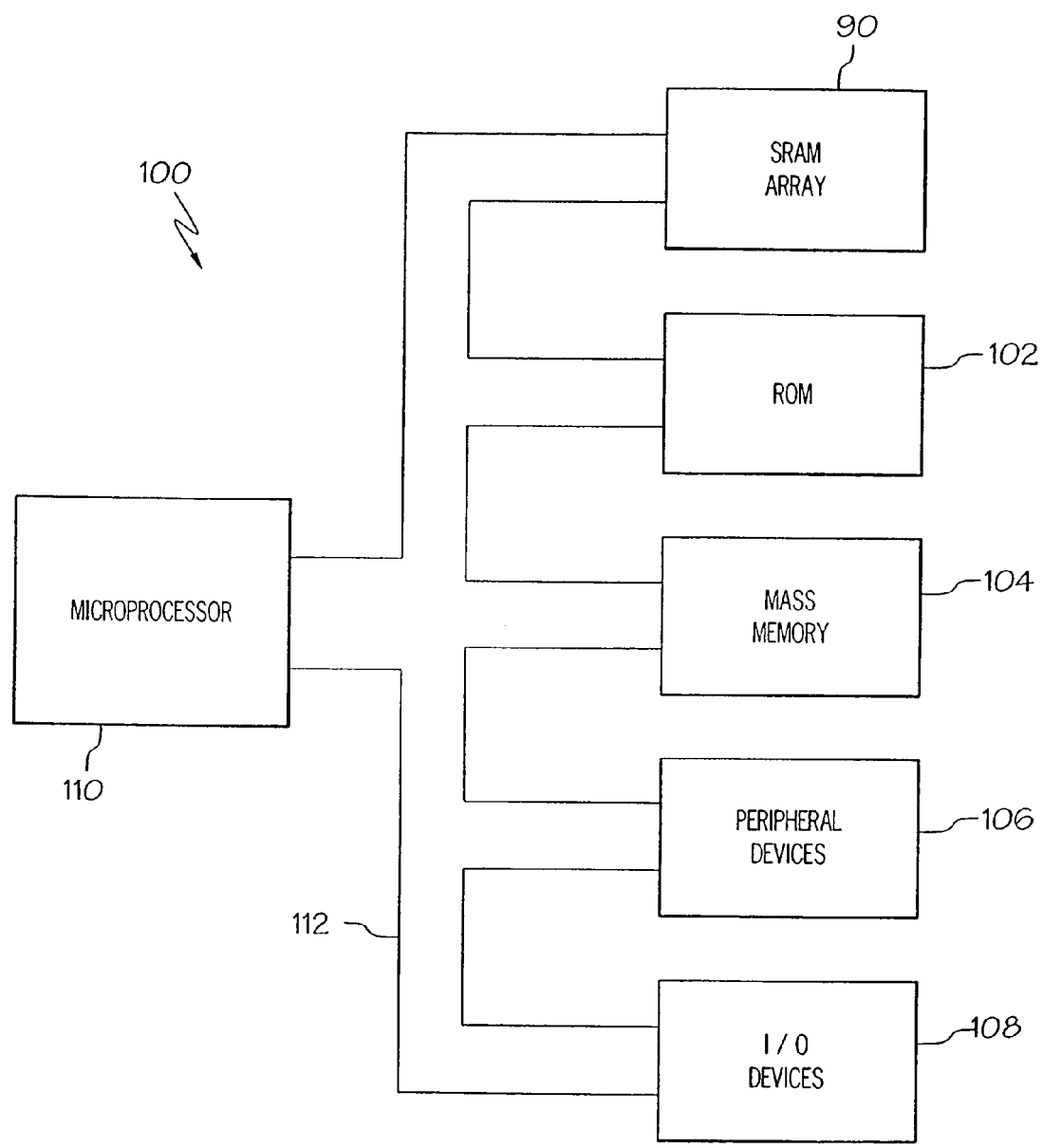
FIG. 8 illustrates schematically a computer system using the SRAM memory array of FIG. 6.

Referring now to FIG. 8, it is contemplated by the present invention that the SRAM memory array 90, described above with respect to FIG. 6, may be utilized to provide an SRAM memory array 90 within a computer system 100. As will be appreciated by those skilled in the art, the computer system 100 would include, as appropriate, a ROM 102, a mass memory 104, peripheral devices 106, and I/O devices 108 in communication with a microprocessor 110 via a data bus 112 or another suitable data communication path. The microprocessor 110 communicates with each of the plurality of memory cells 30 via the memory decoder 92.

Having described the invention in detail and by reference to preferred embodiments thereof, it will be apparent that modifications and variations are possible without departing from the scope of the invention defined in the appended claims.

What is claimed is:

1. A method of fabricating a memory cell comprising the steps of:

providing a substrate assembly having at least one semiconductor layer;

forming a first semiconductor structure within said at least one semiconductor layer;

forming a first source and a first drain of a first pull-up transistor in said first semiconductor structure;

forming a second source and a second drain of a first pull-down transistor in said at least one semiconductor layer;

forming a first contact and a second contact within said first semiconductor structure;

forming a first gate for said first pull-up transistor and a second gate for said first pull-down transistor;

coupling said first drain to said second drain;

coupling said first gate to said second gate; and coupling said first source to one of said first and second contacts such that with the other of said first and second contacts coupled to a first voltage input said first source is coupled to said first voltage input through parasitic resistance of said first semiconductor structure.

2. The method of claim 1, further comprising the step of forming an access transistor in said at least one substrate assembly, said access transistor having one terminal coupled to said first and second drains.

3. The method of claim 2, wherein said access transistor further comprises an additional terminal and an access gate, said additional terminal coupled to a column line of a memory array and said access gate coupled to a row line of said memory array.

4. The method of claim 1, wherein:

said first contact is formed a first distance from said first source;

said first distance defines a first component of said parasitic resistance;

said second contact is formed a second distance from said first source; and said second distance defines a second component of said parasitic resistance.

5. The method of claim 4, further comprising the step of forming a first parasitic bi-polar transistor including a base, wherein said base is coupled to said first contact through said second component of said parasitic resistance and to said second contact through said first component of said parasitic resistance.

6. The method of claim 4, wherein said first component of said parasitic resistance and said second component of said parasitic resistance are connected in series.

7. The method of claim 4, wherein said first component of said parasitic resistance is at least as large as said second component of said parasitic resistance.

8. The method of claim 4, wherein said first component of said parasitic resistance is larger than said second component of said parasitic resistance.

9. The method of claim 5, wherein a base emitter junction of said first parasitic bipolar transistor is configured such that the junction can not become forward biased.

10. The method of claim 1, wherein a resistance value of said parasitic resistance is as a function of the separation between said first and second contacts.

11. The method of claim 1, wherein:
said at least one semiconductor layer comprises P-type semiconductor material; and,
wherein said semiconductor structure comprises an N-type well.

12. The method of claim 1, wherein said first pull-up transistor and said first pull-down transistor form an inverter.

13. The method of claim 12, wherein said inverter is a CMOS inverter.

14. The method of claim 1, wherein said semiconductor structure is configured to define an SRAM memory cell.

15. The method of claim 1, wherein said first source is always at a potential less than or equal to a potential of said first voltage input.

16. The method of claim 1, wherein said first source is coupled to one of said first and second contacts by forming an electrically conducting interconnect layer over said first semiconductor structure.

17. The method of claim 15, wherein said conducting interconnect layer comprises a metallization connection.

18. The method of claim 1, wherein said first pull-up transistor is formed between said first and second contacts.

19. A method of fabricating a memory cell comprising the steps of:
providing a substrate assembly having at least one semiconductor layer;
forming a first semiconductor structure and a second semiconductor structure within said at least one semiconductor layer;
forming a first source and a first drain of a first pull-up transistor in said first semiconductor structure;
forming a second source and a second drain of a first pull-down transistor in said at least one semiconductor layer;
forming a third source and a third drain of a second pull-tip transistor in said second semiconductor structure;
forming a fourth source and a fourth drain of a second pull-down transistor in said at least one semiconductor layer;
forming a first contact and a second contact within said first semiconductor structure;
forming a third contact and fourth contact within said second semiconductor structure;
forming a first gate for said first pull-up transistor, a second gate for said first pull-down transistor, a third gate for said second pull-up transistor and a fourth gate for said second pull-down transistor;
coupling said first drain to said second drain and said third drain to said fourth drain;
coupling said first gate to said second gate and said third gate to said fourth gate; and
coupling said first source to one of said first and second contacts such that with the other of said first and second contacts coupled to a first voltage input said first source is coupled to said first voltage input through parasitic resistance of said first semiconductor structure; and coupling said third source to one of said third and fourth contacts such that with the other of said third and fourth contacts coupled to said first voltage input said third source is coupled to said first voltage input through parasitic resistance of said second semiconductor structure.

20. The method of claim 19, wherein said first semiconductor structure and said second semiconductor structure form portions of a single substrate.

* * * * *